Sept. 6, 1966 C. A. ADAMS 3,271,698

OSCILLATOR WITH RESONANT CIRCUIT CONNECTED TO TRANSISTOR HOUSING

Filed Jan. 6, 1965

Inventor

Charles A. Adams

By Mueller & Aichele

Attys.

United States Patent Office 3,271,698

Patented Sept. 6, 1966

3,271,698

OSCILLATOR WITH RESONANT CIRCUIT CONNECTED TO TRANSISTOR HOUSING

Charles A. Adams, Scottsdale, Ariz., assignor to Motorola, Inc., Franklin Park, Ill., a corporation of Illinois Filed Jan. 6, 1965, Ser. No. 423,682
5 Claims. (Cl. 331—117)

Figure 1:
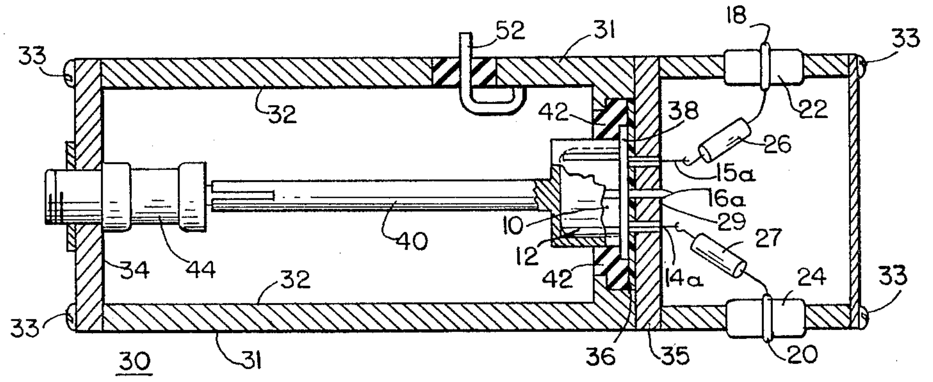

The present invention relates to ultra high frequency oscillators, and is more particularly directed to a resonator structure for an ultra high frequency oscillator employing a semiconductor.

One of the major problems in using transistors at microwave frequencies involves connecting the transistor to the circuit element without incurring unwanted inductance and capacitance due to the transistor package feed length and geometrical configuration.

It is a common practice to construct vacuum tubes for microwave applications by designing them so they can be incorporated into and form a part of a resonant structure. These known resonant structures, however, are not readily adaptable for use with transistors because of size differential between transistors and vacuum tubes and the necessity of having, at the minimum, two cavities in the vacuum tube resonator.

It is, therefore, an object of this invention to provide an improved resonator structure for an ultra high frequency oscillator utilizing a semiconductor.

It is another object of this invention to provide an improved resonator structure for an ultra high frequency oscillator capable of using transistors in standard packages at their maximum frequency of oscillation.

It is still another object of this invention to provide an ultra high frequency oscillator employing a transistor, which is exceptionally compact and reliable, and of simple construction.

It is a further object of this invention to provide an ultra high frequency oscillator which uses a single tuned circuit, thereby permitting a single tuning adjustment to provide operation over a range of frequencies.

A feature of the invention is the provision of an ultra high frequency oscillator employing a transistor having a conducting housing connected to an active element thereof, and including a hollow conducting structure having one end wall capacitively coupled to the transistor, and an elongated conducting member in electrical contact with the transistor housing and extending coaxially within the conducting structure and connected to the other end thereof by a variable capacitor. The hollow conducting structure, the coaxial conducting member and the variable capacitor conjunctively form a resonant circuit so that the internal positive feedback within the transistor will sustain oscillation at a frequency determined by the resonant circuit.

Another feature of the invention is the provision, in an ultra high frequency oscillator, of a coaxial transmission line and a tunable capacitor to conjunctively form a resonant circuit connected to an active element of a transistor, for determining the frequency of oscillation thereof.

Still another feature of the invention is the provision in an ultra high frequency oscillator of having a resonator structure constructed to efficiently couple signals from the oscillator to other circuit elements.

Figure 2:
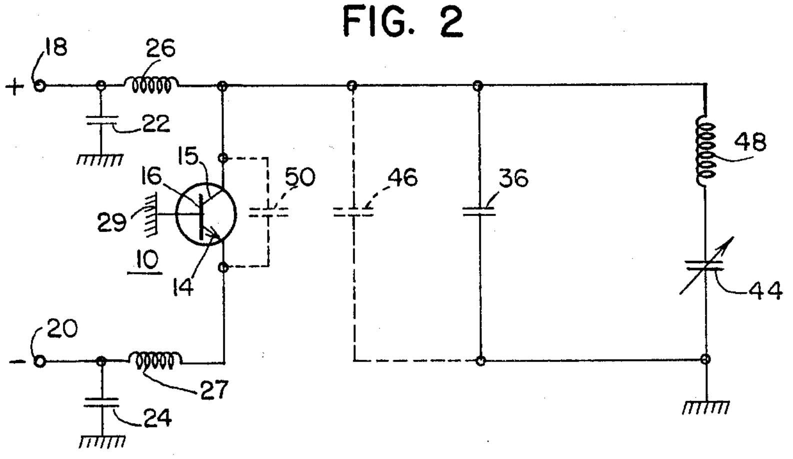

In the drawing:

FIG. 1 is a longitudinal sectional view of one embodiment of the ultra high frequency oscillator in accordance with the invention; and FIG. 2 is a schematic representation of the ultra high frequency oscillator.

In accordance with the invention the ultra high frequency oscillator circuit includes a transistor which has a conducting housing and emitter, collector and base electrodes. The base electrode is connected to a reference potential, and a potential source is connected to the emitter and collector electrode and provides bias therefor. The resonator structure for the oscillator includes a hollow elongated conducting structure having end walls with the transistor housing capacitively coupled to one of the end walls. An elongated conducting member extends coaxially within the hollow conducting structure, and is in electrical contact with the transistor conducting housing, which is connected to the collector electrode. A variable capacitor couples the coaxial conducting member with the other end of the hollow elongated structure so that the hollow conducting structure, the coaxial member and the variable capacitor conjunctively form a resonant circuit that is variable over a range of frequencies. Internal capacitance between the collector and emitter electrodes cooperating with the grounded base electrode provides positive feedback of current from the collector electrode to the emitter electrode, in phase with the emitter current, to sustain oscillations at microwave frequencies.

FIGS. 1 and 2 show one embodiment of the oscillator of the invention which includes transistor 10 having a conducting housing 12, with emiter electrode 14, collector electrode 15 and base electrode 16 therein. The leads extending from the emitter, collector and base electrodes are designated 14*a*, 15*a* and 16*a*, respectively, in FIG. 1. Potential applied to terminals 18 and 20 are bypassed by capacitors 22 and 24, and coupled through RF chokes 26 and 27, to the collector electrode 15 and the emitter electrode 14 of the transistor 10. The base electrode 16 is connected to a reference potential at 29, and the conducting housing 12 is in contact with the collector electrode 15.

The resonator structure 30 may take various shapes. Important to the selection of the configuration, however, is the fact that the calculation of resonant frequency can be made more easily for geometrical shapes such as cylinders and rectangular prisms than for unsymmetrical shapes. For this reason the embodiment is depicted in FIG. 1 as being either a cylindrical or a rectangular prism in shape, but it should be understood that other shapes are possible.

The structure 30 includes a hollow conducting structure or cavity 32 delimited by end walls 34 and 35, which are secured by screws 33 to the side walls 31. The case flange 38 of transistor 10 is held in place by insulating packing 42, which may be of Rexolite, with a Mylar dielectric washer 36 positioned between the flange 38 and the end wall 35 of the conducting structure 32. This Mylar washer acts as the dielectric of a capacitor (schematically indicated at 36 in FIG. 2) and together with the internal capacitance 46 between the collector electrode 15 and base electrode 16 of the transistor minimizes the reactive effects of the transistor output admittance, caused by temperature and power supply variation, on the frequency of oscillation.

An elongated conducting member 40 is mounted in electrical contact with the transistor conducting housing 12, and extends coaxialy within the hollow conducting structure 32. Variable capacitor 44 couples the coaxial conducting member 40 to end wall 34 of the hollow elongated structure 32. This results in the hollow conducting structure 32, the coaxial member 40 and the variable capacitor 14 conjunctively forming a resonant tank circuit. This tank circuit is schmatically shown in FIG. 2, with the coil 48 representing the inductance of the hollow conducting structure 32 and the coaxial member 40, is in series with the variable capacitor 44.

The operation of a transistor ocillator is known to those familiar with the art and will be discussed only to the extent necessary for an understanding of the present invent. Any excitation at the emitter 14 by the potential source at 20 will bias the transistor 10 into conduction, with the collector 15 providing a conductive connection to the series resonant tank circuit consisting of coil 48 and variable capacitor 44. The resonant frequency of this tank circuit determines the frequency of oscillation of the device and may be varied over a wide range, for instance 1500 mc. to 2000 mc., by adjusting variable capacitor 44. The signal is fed back from the output circuit to the input circuit of the transistor, with the current fed back being in phase with the current in the input circuit, and of a magnitude to compensate for the normal circuit losses to thereby sustain oscillation. This is accomplished by connecting the base electrode 16 to the reference potential at 29 so that the internal capacitance 50 (FIG. 2) between the emitter 15 and the collector 14 provides feedback of a signal of sufficient magnitude and proper phase. The RF chokes 26 and 27 and bypass capacitors 20 and 22 isolate the ultra high frequencies developed by the oscillator from the source of bias potential.

Signals from the oscillator may be inductively coupled from the cavity 32 by an output coupling loop 52 located at the approximate position of minimum amplitude of a voltage standing wave and a current maximum. The area and orientation of the loop will determine the degree of coupling and hence the impedance match between the resonator and the output line. Other methods known to those familiar with the art such as an output probe could be used to couple the power from the resonator.

The improved oscillator circuit in accordance with this invention uses a transistor and a single resonant structure to provide an ultra high frequency oscillator tunable over a wide range of frequencies. The oscillator as described is compact, reliable, and simple in construction, capable of using transistors in conventional packages to their maximum frequency of operation.

I claim:

1. A resonator structure for an ultra high frequency oscillator employing a transistor having a conducting housing connected to an element thereof, the resonator structure including in combination, a hollow conducting structure having end walls, means supporting the transistor housing on one of said end walls and forming a capacitive coupling therebetween, an elongated conducting member in electrical contact with the transistor housing and extending coaxially within said hollow conducting structure, capacitor means coupling the other end of said hollow conducting structure with said coaxial conducting member, with said conducting structure, said member and said capacitor means conjunctively forming a resonant circuit.

2. A resonator structure for an ultra high frequency oscillator employing a transistor having a conducting housing connected to an element thereof, the resonator structure including in combination, a hollow conducting structure having end walls, means connecting the transistor housing to one of said end walls, an elongated conducting member in electrical contact with the transistor conducting housing and extending within said hollow conducting structure, variable impedance means coupling the other end of said hollow conducting structure with said elongated conducting member, with said conducting structure, said member and said variable impedance means conjunctively forming a resonant circuit variable over a relatively wide frequency range, and coupling means coupling signals from said hollow conducting structure.

3. A resonator structure for an ultra high frequency oscillator employing a transistor having a conducting housing and emitter, collector and base electrodes, the housing being connected to said collector electrode, the resonator structure including in combination, a hollow conducting structure having end walls with means connecting said transistor housing to one of said end walls and providing capacitive coupling therebetween, an elongated conducting member in electrical contact with said transistor conducting housing and extending coaxially within said hollow conducting structure, tunable capacitor means coupling the other end of said hollow conducting structure with said coaxial conducting member, with said hollow conducting structure, said member and said tunable capacitor means conjunctively forming a resonant circuit variable over a range of frequencies and coupling means including an output coupling loop coupling signals from said hollow conducting structure.

4. An oscillator circuit including in combination, a transistor having a conducting housing and input and output electrodes, the conducting housing connected to said output electrodes, means including bias voltage supply means for biasing said transistor, a resonator structure including, a hollow conducting structure having end walls, means connecting the transistor housing to one of said end walls, an elongated conducting member in electrical contact with said conducting housing of said transistor, and extending within said hollow conducting structure, and variable impedance means coupling the other end wall of said hollow conducting structure with said elongated member so that said conducting structure, said elongated member and said variable impedance means conjunctively form a resonant circuit variable over a range of frequencies, said transistor providing internal positive feedback between said output and said input electrodes for sustaining oscillation at a frequency determined by said resonant circuit.

5. An oscillator circuit including in combination, a transistor having a conducting housing and emitter, collector and base electrodes, with said conducting housing connected to said collector electrode, bias voltage supply means for biasing said electrodes, means connecting said base electrode to a point of reference potential, a resonator structure including a hollow elongated conducting structure having end walls, means connecting said transistor housing to one of said end walls and providing capacitive coupling therebetween, an elongated conducting member in electrical contact with said conducting housing of said transistor and extending coaxially within said hollow conducting structure, tunable capacitor means coupling the other end wall of said hollow conducting structure with said coaxial conducting member so that said conducting structure, said coaxial member and said tunable capacitor means conjunctively form a resonant circuit variable over a range of frequencies, said transistor having internal capacitance providing positive feedback between said collector and emitter electrodes for sustaining oscillation at a frequency determined by said resonant circuit and coupling means including an output coupling loop coupling signals from said hollow conducting structure.

References Cited by the Applicant

UNITED STATES PATENTS

| | | |
|---|---|---|
| 2,797,324 | 6/1957 | Midlock. |
| 2,805,335 | 9/1957 | Kendall et al. |
| 2,817,761 | 12/1957 | Hollmann. |
| 3,124,764 | 3/1964 | Stearns. |
| 3,141,141 | 7/1964 | Sharpless. |

ROY LAKE, *Primary Examiner.*

J. KOMINSKI, *Assistant Examiner.*